United States Patent
Yasuda et al.

(10) Patent No.: US 8,878,336 B2
(45) Date of Patent: Nov. 4, 2014

(54) FUSE

(75) Inventors: Makoto Yasuda, Kuwana (JP); Kazuyoshi Arimura, Kasugai (JP); Yoshiharu Kato, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 56 days.

(21) Appl. No.: 13/590,581

(22) Filed: Aug. 21, 2012

(65) Prior Publication Data

US 2013/0049165 A1 Feb. 28, 2013

(30) Foreign Application Priority Data

Aug. 22, 2011 (JP) ................. 2011-180676

(51) Int. Cl.
*H01L 29/00* (2006.01)
*H01L 23/52* (2006.01)
*H01L 49/02* (2006.01)
*H01L 23/525* (2006.01)
*H01L 21/66* (2006.01)

(52) U.S. Cl.
CPC ............ *H01L 23/5256* (2013.01); *H01L 28/20* (2013.01); *H01L 22/22* (2013.01); *H01L 23/5252* (2013.01)
USPC ............................. 257/529; 257/528; 257/530

(58) Field of Classification Search
CPC ....... H01L 22/22; H01L 23/52; H01L 23/525; H01L 23/5252; H01L 23/5256
USPC ............ 257/50, 209, 528, 529, 530, E23.146, 257/E23.147, E23.149
See application file for complete search history.

(56) References Cited

U.S. PATENT DOCUMENTS 5,955,380 A 9/1999 Lee
2006/0102982 A1* 5/2006 Park et al. .................... 257/528

FOREIGN PATENT DOCUMENTS

| JP | 3-153056 A | 7/1991 |
| JP | 4-192459 A | 7/1992 |
| JP | 11-163154 A | 6/1999 |
| JP | 2002-237524 A | 8/2002 |
| JP | 2007-194377 A | 8/2007 |
| JP | 2007-536744 A | 12/2007 |
| WO | 2005/109516 A1 | 11/2005 |

OTHER PUBLICATIONS

Japanese Office Action dated Aug. 26, 2014, issued in corresponding Japanese Patent Application No. 2011-180676 (2 pages).

* cited by examiner

*Primary Examiner* — Yasser A Abdelaziez
*Assistant Examiner* — Cory Eskridge
(74) *Attorney, Agent, or Firm* — Westerman, Hattori, Daniels & Adrian, LLP

(57) ABSTRACT

A fuse includes a first conductor, an insulating film on the first conductor, a second conductor on the insulating film, a first plug coupled to the first conductor, a second plug and a third plug each coupled to the second conductor, and a cover film formed on the second conductor and having tensile strength.

17 Claims, 9 Drawing Sheets

US 8,878,336 B2

FUSE

CROSS-REFERENCE TO RELATED APPLICATIONS

This application is based upon and claims the benefit of priority from prior Japanese Patent Application No. 2011-180676, filed on Aug. 22, 2011, the entire contents of which are incorporated herein by reference.

FIELD

The embodiments discussed herein are related to a fuse.

BACKGROUND

A conventional semiconductor device includes a trimming circuit for the setting of a redundant circuit or for adjusting resistance values. The trimming circuit includes an element such as a fuse which changes from a conductive state to a non-conductive state in response to the applied voltage or current. With this kind of trimming circuit, it is difficult for the melted and disconnected portions of the fuse to be separated at a sufficient insulating distance, and there are cases where the melted and disconnected portions changes to the connecting condition with the lapse of time. Thus, a trimming circuit of a different conventional example includes an element such as an antifuse which changes from a non-conductive state to a conductive state based on a writing voltage (for example, refer to Japanese National Phase Laid-Open Patent Publication No. 2007-536744).

An antifuse includes two conductors which sandwich an insulating film therebetween. In order to change the antifuse to a conductive state, a high voltage is applied between the two conductors so as to rupture the insulating film. Accordingly, a semiconductor device that includes a trimming circuit including an antifuse uses elements and control circuits that are compliant with the high voltage. These elements and control circuits enlarge the size of the semiconductor device.

SUMMARY

According to an aspect of the embodiments, a fuse including a first conductor, an insulating film on the first conductor, a second conductor on the insulating film, a first plug coupled to the first conductor, a second plug and a third plug each coupled to the second conductor, and a cover film located on the second conductor and having tensile strength.

The object and advantages of the invention will be realized and attained by means of the elements and combinations of particularly pointed out in the claims.

It is to be understood that both the foregoing general description and the following detailed description are exemplary and explanatory and are not restrictive of the invention.

DESCRIPTION OF EMBODIMENTS

An embodiment is now discussed with reference to the appended drawings. The diagrams may not always represent the actual size.

Figure 1A:
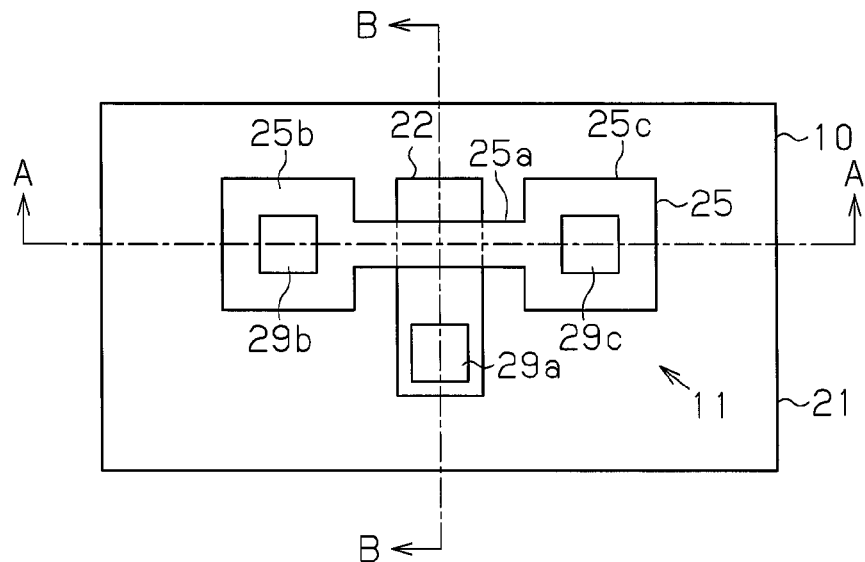
FIG. 1A is a schematic plan view of a fuse element.
Figure 1B:
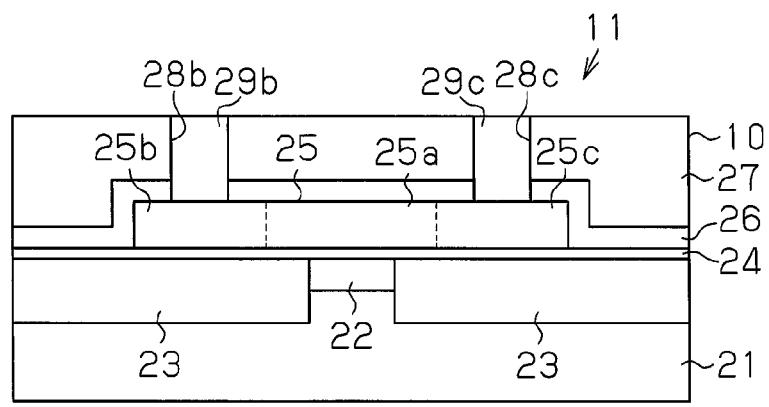
FIG. 1B is a cross sectional view of the fuse element taken along line A-A in FIG. 1A.

As illustrated in FIG. 1A, a fuse element 11 is formed on a semiconductor device 10. The fuse element 11 schematically includes a diffusion region 22, and a conductor 25. As illustrated in FIG. 1B, the conductor 25 is formed above the diffusion region 22. As illustrated in FIG. 1A, when viewed from above a semiconductor substrate 21, the conductor 25 overlaps with a part of the diffusion region 22. The diffusion region 22 is an example of a first conductor, and the conductor 25 is an example of the second conductor.

As illustrated in FIG. 1B, for example, a highly-doped $N^+$ diffusion region 22 is formed on the semiconductor substrate 21 of the semiconductor device 10. The diffusion region 22 may be rectangular from a planar view. The length of the narrow side of the diffusion region 22 is, for example, 1.5 µm (micrometers).

An element isolation region 23 is formed on the semiconductor substrate 21. The element isolation region 23 electrically isolates the diffusion region 22 from another element (not illustrated) formed on the semiconductor substrate 21. The element isolation region 23 is formed, for example, from local oxidation of silicon (LOCOS) or shallow trench isolation (STI).

An insulating film 24 is formed on the semiconductor substrate 21 including the diffusion region 22. The insulating film 24 is, for example, a silicon oxide film ($SiO_2$). The film thickness of the insulating film 24 is, for example, 18 nm (nanometers).

A conductor 25 is formed on the insulating film 24. The conductor 25 is, for example, a polycrystalline silicon (hereinafter abbreviated as "polysilicon") film. The conductor 25 includes a connection strip 25a formed in an oblong shape extending along a predetermined direction (horizontal direction in FIG. 1B), and terminals 25b, 25c formed in a rectangular shape at both ends of the connection strip 25a. The connection strip 25a has, for example, a length of 2 µm, a width of 1.2 µm, and a thickness of 400 nm.

A cover film 26 is formed on the conductor 25. The cover film 26 is formed so as to cover an upper surface and a side surface of the conductor 25. The cover film 26 has greater tensile strength than the insulating film 24. The cover film 26 is, for example, a silicon nitride film (SiN, $Si_3N_4$). The silicon nitride film has relatively high tensile strength. For example, the silicon nitride film (SiN) has a film thickness of 30 nm, and tensile strength of 1 GPa (gigapascal).

Figure 1C:
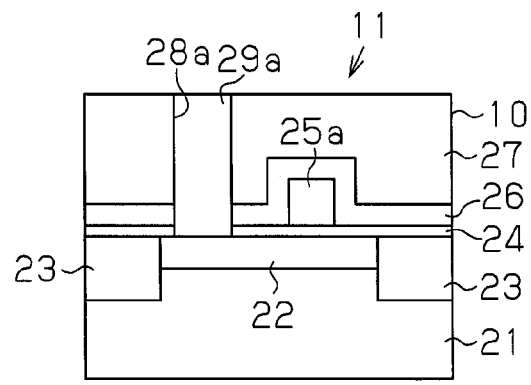
FIG. 1C is a cross sectional view of the fuse element taken along line B-B in FIG. 1A.

An inter-layer insulating film 27 is formed on the cover film 26. The inter-layer insulating film 27 is, for example, a silicon oxide film. The upper surface of the inter-layer insulating film 27 may be flat. A wire layer (not illustrated) may be formed on the upper surface of the inter-layer insulating film 27. As illustrated in FIG. 1C, a contact hole 28a which extends from the upper surface to the diffusion region 22 is formed on the inter-layer insulating film 27. A plug 29a coupled to the diffusion region 22 is formed in the contact hole 28a. Similarly, as illustrated in FIG. 1B, contact holes 28b, 28c which extend from the upper surface to the terminals 25b, 25c of the conductor 25 are formed on the inter-layer insulating film 27. Plugs 29b, 29c respectively coupled to the terminals 25b, 25c of the conductor 25 are formed in the contact holes 28b, 28c. The plugs 29a to 29c are, for example, tungsten (W).

Figure 2A:
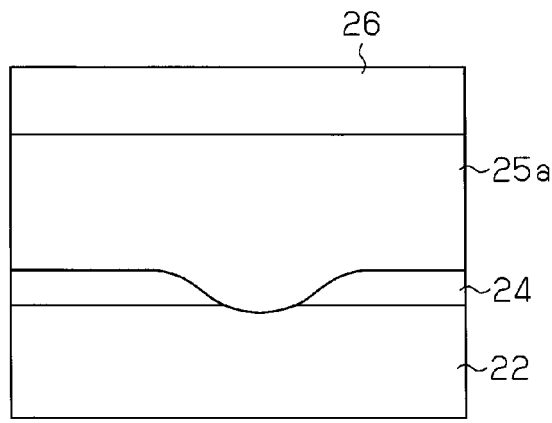
FIG. 2A, FIG. 2B, FIG. 3A and FIG. 3B are schematic diagrams illustrating the expansion of the connection strip of the fuse.
Figure 2B:
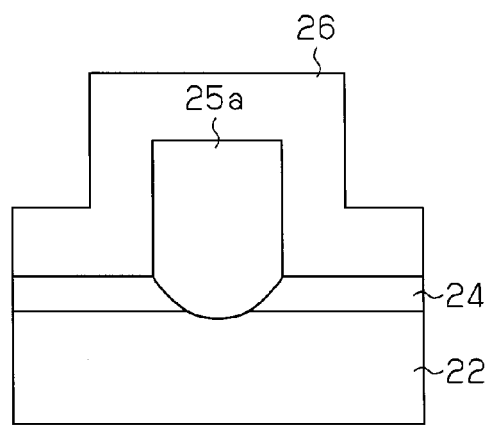
Figure 3A:
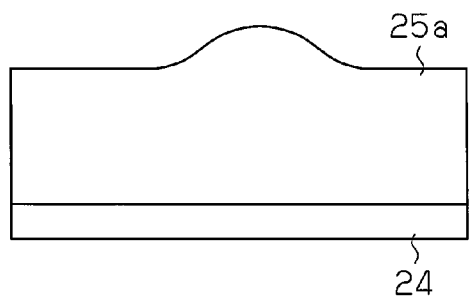
Figure 3B:
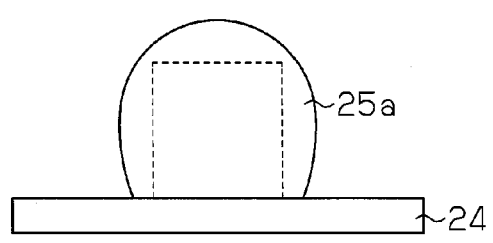

A current Ip for programming the fuse element 11 is supplied between the plugs 29b, 29c coupled to the conductor 25. The programming current Ip is, for example, 100 mA (milliampere) to 400 mA. The connection strip 25a of the conductor 25 produces heat, for example in excess of 1400° C., and expands due to the current Ip. In one example, the connection strip 25a of the conductor 25 may become fused due to the expansion. FIG. 3A and FIG. 3B are reference examples of the connection strip 25a which is not covered by the cover film 26. In these reference examples, the connection strip 25a formed on the insulating film 24 expands upward. Meanwhile, in the embodiment illustrated in FIG. 1B and FIG. 1C, the upper surface and the side surface of the connection strip 25a are covered with the cover film 26. The cover film 26 is a film having relatively high tensile strength. Accordingly, the cover film 26 makes it difficult for the connection strip 25a to expand upward. Consequently, in the examples illustrated in FIG. 2A and FIG. 2B, the connection strip 25a expands downward; that is, in a direction where the cover film 26 is not formed (or toward the opening of the cover film 26). Accordingly, the connection strip 25a that expands downward bursts through the insulating film 24 and becomes connected to the diffusion region 22. Consequently, the plug 29a illustrated in FIG. 1A becomes connected with the respective plugs 29b, 29c via the expanded conductor 25 (connection strip 25a).

Figure 4:
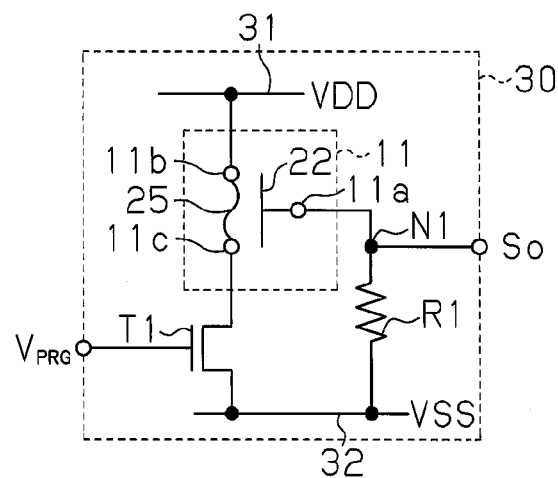
FIG. 4 is a circuit diagram of the trimming circuit.

The foregoing fuse element 11 is used, for example, in the trimming circuit 30 illustrated in FIG. 4.

The trimming circuit 30 includes a fuse element 11, a driver transistor T1, and a resistor R1.

The fuse element 11 includes a first electrode (diffusion region) 22 and a second electrode (conductor) 25 which are mutually insulated. The first electrode 25 is coupled to a first terminal 11a, and the first terminal 11a is coupled to an output node N1. The second electrode 25 is arranged between a second terminal 11b and a third terminal 11c. The second terminal 11b is coupled to a wire 31 to which a higher level voltage VDD is supplied, and the third terminal 11c is coupled to the driver transistor T1. The first to third terminals 11a to 11c respectively correspond to the plugs 29a to 29c illustrated in FIG. 1A.

The driver transistor T1 is, for example, an N-channel MOS transistor. The source of the driver transistor T1 is coupled to a wire 32 to which a lower level voltage VSS is supplied, the drain is coupled to the third terminal 11c of the fuse element 11, and a programming voltage $V_{PRG}$ is supplied to the gate. The driver transistor T1 is formed to cause the programming current Ip to flow to the fuse element 11. For example, the gate length L and the gate width W of the driver transistor T1 are 0.8 μm and 1400 μm, respectively.

The output node N1 is coupled to a first terminal of the resistor R1, and a second terminal of the resistor R1 is coupled to the wire 32. The resistance value of the resistor R1 is, for example, 1 MΩ (megohm).

In the initial state of the trimming circuit 30, the first electrode 11a and the second electrode 11b of the fuse element 11 are in a non-conductive state. Here, the output node N1 is pulled down by the resistor R1, and is of a lower level voltage VSS level (L level). Accordingly, the trimming circuit 30 generates an L-level signal So.

When programming the fuse element 11, a pulsed programming voltage $V_{PRG}$ is supplied to the gate of the driver transistor T1. The programming voltage $V_{PRG}$ includes, for example, an amplitude of 7 V (volts), a pulse width tW of 100 μs (microseconds), and a rising edge transition time tr of 1 μs.

When the driver transistor T1 is turned ON based on the programming voltage $V_{PRG}$ applied to the gate, the current IP flows from the wire 31, to which the higher level voltage VDD is supplied, toward the wire 32, to which the lower level voltage VSS is supplied via the fuse element 11 and the driver transistor T1. Based on the current Ip, the first electrode 11a of the fuse element 11 becomes fused and ruptured, and the first electrode 11a and the second electrode 11b become mutually connected. Consequently, the output node N1 becomes a higher level voltage VDD level (H level). Accordingly, the trimming circuit 30 generates an H-level signal So.

Figure 5:
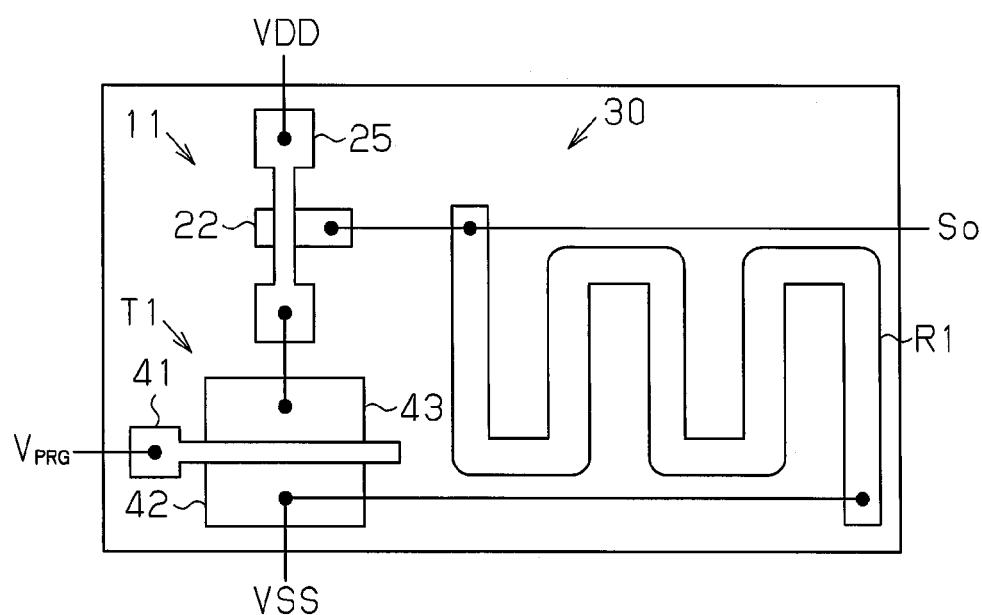
FIG. 5 is a schematic plan view of the semiconductor device.

As illustrated in FIG. 5, the fuse element 11, the driver transistor T1, and the resistor R1 included in the trimming circuit 30 are formed on the semiconductor device 40. The black circles in the diagram represent the plugs.

The driver transistor T1 includes a gate wire 41, a source region 42, and a drain region 43. The gate wire 41 is a wire that is formed from polycrystalline silicon. The source region 42 and the drain region 43 are N-type diffusion regions. The resistor R1 is formed from polycrystalline silicon. Accordingly, the conductor 25 of the fuse element 11 may be formed simultaneously with the gate wire 41 and the resistor R1 of the driver transistor T1.

Figure 6:
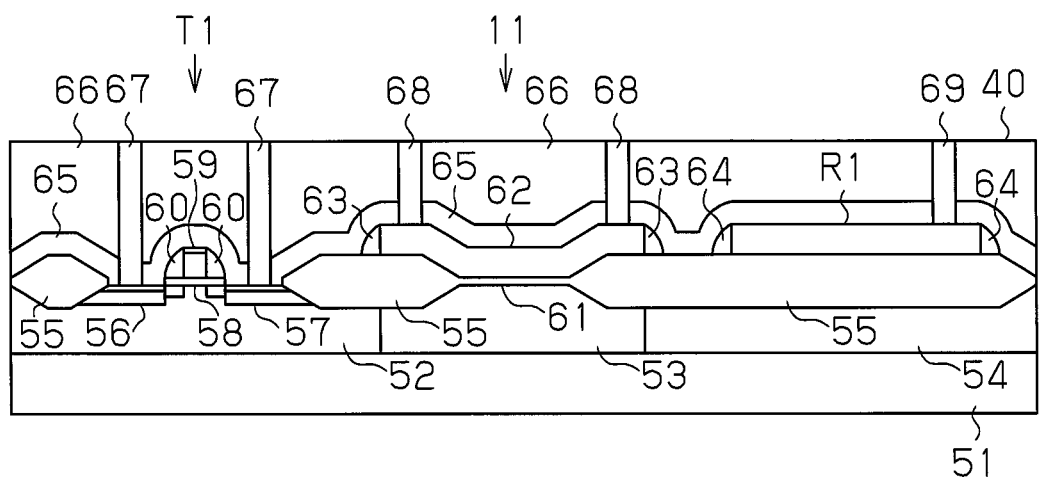
FIG. 6 is a schematic cross sectional view of the semiconductor device.

FIG. 6 illustrates the cross section of the semiconductor device 40. For the sake of convenience of explanation, in FIG. 6, the driver transistor T1 and the fuse element 11 and the resistor R1 are arranged in a line.

As illustrated in FIG. 6, a P-type well region 52 corresponding to the driver transistor T1, an N-type well region 53 corresponding to the fuse element 11, and a P-type well region 54 corresponding to the resistor R1 are formed on the semiconductor substrate (silicon substrate) 51. The N-type well region 53 is an example of the first conductor. An element isolation region 55 is formed on the semiconductor substrate 51. The element isolation region 55 is formed, for example, via the LOCOS method.

A source region 56 and a drain region 57 are formed on the well region 52. The source region 56 and the drain region 57 respectively include a lightly-doped $N^-$ diffusion region and a highly-doped $N^+$ diffusion region. A silicide layer is formed on the source region 56 and the drain region 57, respectively. A gate wire 59 is formed on the well region 52 via a gate oxide film 58. The gate wire 59 is formed from polycrystalline silicon (polysilicon). A silicide layer is formed at the upper part of the gate wire 59. The silicide layer is formed, for example, by causing polysilicon to reach with a high melting point metal material (cobalt (Co), for example). A side wall 60 is formed at a side part of the gate wire 59. The side wall 60 is formed, for example, by performing etch-back to the silicon oxide film that was formed so as to cover the gate wire 59.

A conductor 62 is formed on the well region 53 via a silicon oxide film 61. Both ends of the conductor 62 are formed to extend up to the element isolation region 55. The conductor 62 is formed from polycrystalline silicon (polysilicon). A side wall 63 is formed at a side part of the conductor 62.

A resistor R1 is formed on the element isolation region 55 corresponding to the well region 55. The resistor R1 is formed from polycrystalline silicon (polysilicon). A side wall 64 is formed at a side part of the resistor R1.

The cover film 65 covers the elements (bulk). The cover film 65 is a film having relatively high tensile strength, such as a silicon nitride film (SiN, $Si_3N_4$). An inter-layer insulating film 66 is formed on the cover film 65. The inter-layer insulating film 66 is, for example, a silicon oxide film. The upper surface of the inter-layer insulating film 66 may be flat.

Plugs 67 connected to the source region 56 and the drain region 57 of the driver transistor T1 are formed on the semiconductor device 40. Plugs 68 connected to both ends of the conductor 62 are formed on the semiconductor device 40. While omitted in FIG. 6, a plug connected to the N-type well region 53 is formed. A plug 69 connected to the resistor R1 is formed on the semiconductor device. While omitted in FIG. 6, plugs connected to both ends of the resistor R1 are formed. The plugs 67 to 69 may be formed from, for example, tungsten (W).

The method of manufacturing the semiconductor device 40 is now discussed.

Figure 7A:
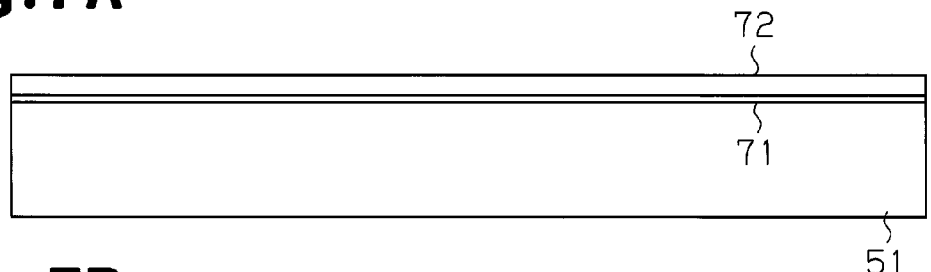
FIG. 7A to FIG. 7E and FIG. 8A to FIG. 8D are schematic cross sectional views illustrating the manufacturing process of the semiconductor device.
Figure 7B:
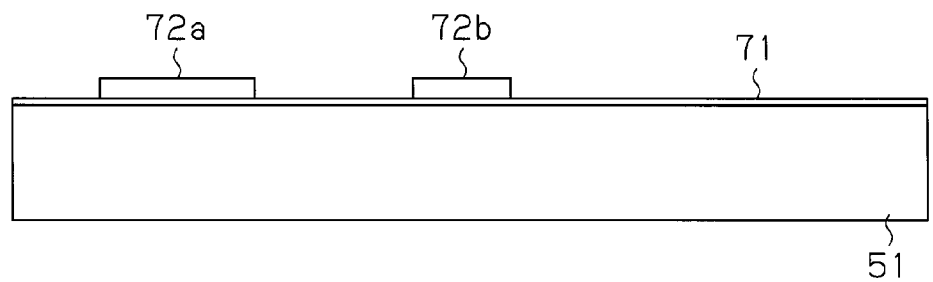

As illustrated in FIG. 7A, an oxide film 71 is formed on one surface (upper surface) of the semiconductor substrate 51, and a silicon nitride film 72 is formed on the oxide film 71. For example, under a temperature condition of 850° C., the semiconductor substrate 51 is subject to thermal oxidation so as to form the oxide film 71 having a film thickness of 3 nm. For example, the silicon nitride film 72 having a film thickness of 115 nm is formed via chemical vapor deposition (CVD) under a temperature condition of 775° C. Subsequently, the silicon nitride film 72 is etched with a resist mask that was formed via the photolithography process and, as illustrated in FIG. 7B, silicon nitride films 72a, 72b for forming element isolation are formed.

Figure 7C:
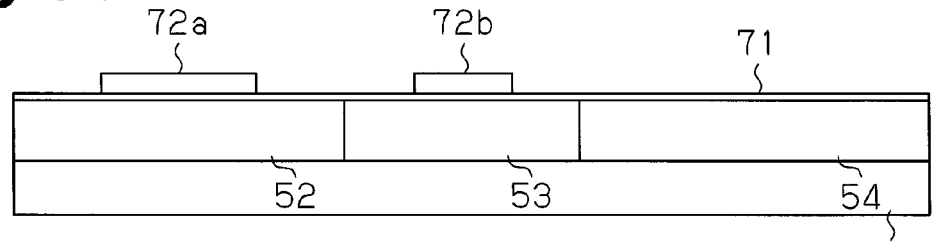

Subsequently, as illustrated in FIG. 7C, for example, well regions 52, 53, 54 are formed via the ion implantation method. The well region 53 is formed on the semiconductor substrate 51 by doping or implanting with an N-type impurity (dopant). The N-type dopant impurity is, for example, phosphorus (P). The ion implantation conditions are, for example, accelerating voltage of 180 keV, and dose amount of $5.0 \times 10^{12}$ $cm^{-2}$. The well regions 52, 54 are formed on the semiconductor substrate 51 by doping or implanting with a P-type impurity (dopant). The P-type dopant impurity is, for example, boron (B). The ion implantation conditions are, for example, accelerating voltage of 160 keV, and dose amount of $1.2 \times 10^{13}$ $cm^{-2}$.

Figure 7D:
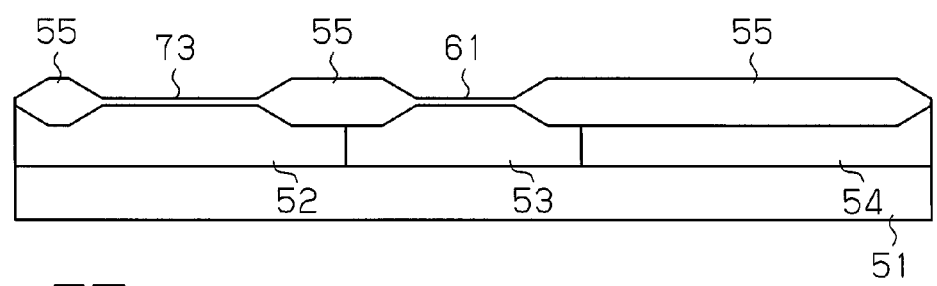
Figure 7E:
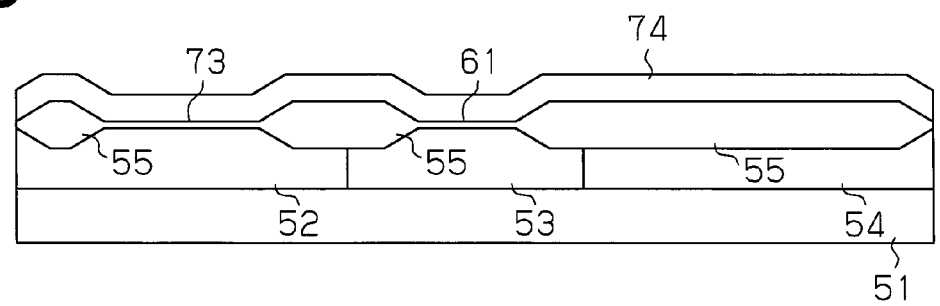

Subsequently, as illustrated in FIG. 7D, for example, the element isolation region 55 having a film thickness of 370 nm is formed via wet oxidation under a temperature condition of 1000° C. The silicon nitride films 72a, 72b illustrated in FIG. 7C are removed. Subsequently, as illustrated in FIG. 7E, for example, thermal oxidation is performed under a temperature condition of 1000° C. to form the oxide films 61, 73 having a film thickness of, for example, 18.5 nm. Subsequently, a polycrystalline silicon film (polysilicon film) 74 having a film thickness of 300 nm is deposited, for example, via the CVD method.

Figure 8A:
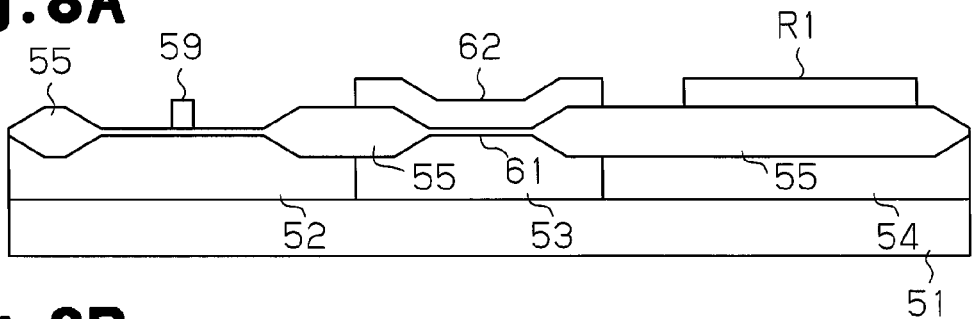
Figure 8B:
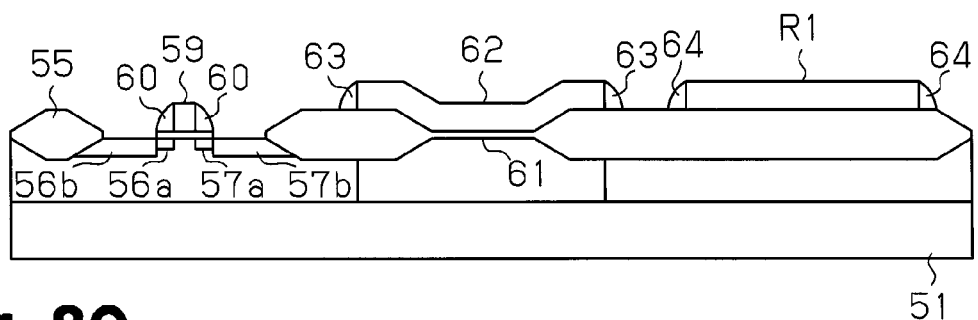

Subsequently, the polysilicon film 74 is etched using the resist mask that was formed via the photolithography process so as to form, as illustrated in FIG. 8A, the gate wire 59 of the driver transistor T1, the conductor 62 of the fuse element 11, and the resistor R1. Subsequently, as illustrated in FIG. 8B, an N-type impurity is doped or implanted into the well region 52 to form lightly-doped $N^-$ diffusion regions 56a, 57a, for example, via the ion implantation method. Subsequently, the side walls 60, 63, 64 are formed. Subsequently, an N-type impurity is doped or implanted into the well region 52 to form highly-doped $N^+$ diffusion regions 56b, 57b, for example, via the ion implantation method.

Figure 8C:
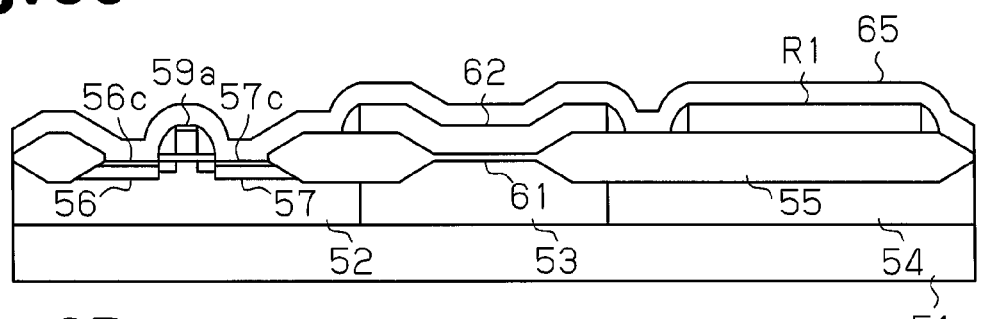
Figure 8D:
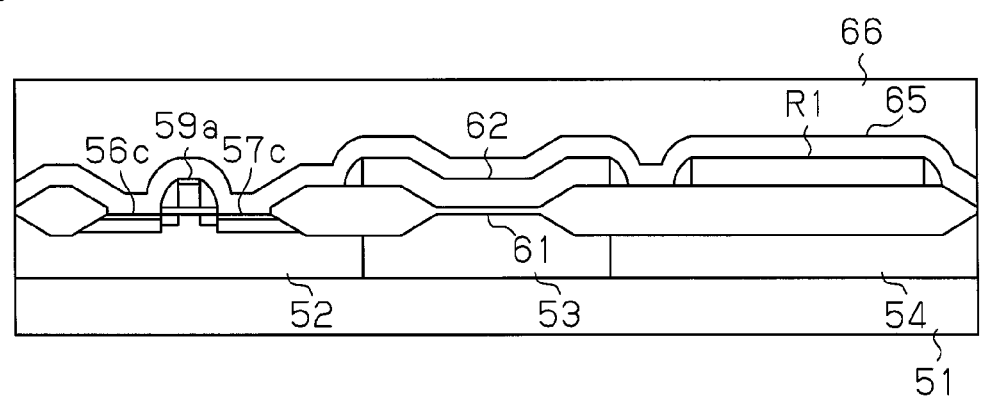

Subsequently, as illustrated in FIG. 8C, silicide layers 59a, 56c, 57c are formed at the upper part of the gate wire 59 and at the upper part of the diffusion regions 56, 57. Subsequently, a cover film 65 having a film thickness of 80 nm is deposited, for example, via the CVD method. Subsequently, as illustrated in FIG. 8D, an inter-layer insulating film 66 having a film thickness of 1400 nm is deposited on the bulk, for example, via the CVD method, and the surface of the inter-layer insulating film 66 is planarized, for example, via the chemical mechanical polishing (CMP) method. The inter-layer insulating film 66 is etched with the cover film 65 as the etching stopper film to form contact holes of different depths. Subsequently, the cover film 65 is etched to expose the silicide layers 56c, 57c, and tungsten is filled in the contact holes, for example, via the CVD method, so as to form the plugs 67 to 69 illustrated in FIG. 6.

As described above, the embodiment yields the following effects.

(1) The fuse element 11 includes a diffusion region 22 formed on the semiconductor substrate 21, an insulating film 24 formed on the diffusion region 22, and a conductor 25 formed on the insulating film 24. In addition, the fuse element 11 includes a cover film 26 on the conductor 25. The cover film 26 has greater tensile strength than the insulating film 24. The cover film 26 is formed so as to cover the upper surface and the side surface of the conductor 25. A programming current Ip is supplied to the conductor 25. The conductor 25 produces heat due to the current Ip, and becomes fused and ruptured. The conductor 25 expands in a direction where the cover film 26 is not formed (or toward the opening of the cover film 26); that is, downward, and ruptures (bursts through) the insulating film 24. Consequently, the conductor 25 becomes connected to the diffusion region 22.

Since the conductor 25 is connected to the diffusion region 22 based on the supplied current Ip, there may be no need to supply a high voltage. Accordingly, the circuit portion for programming the fuse element 11 may not be demanded of insulation resistance in the semiconductor device including the fuse element 11. Accordingly, it is possible to suppress the increase in the size of the semiconductor device.

(2) The fuse element 11 functions as an antifuse as a result of the conductor 25 and the diffusion region 22 short-circuiting. The plugs 29b, 29c connected to both ends of the conductor 25 may not have to be electrically disconnected. Accordingly, there may be no need to give consideration to the possibility of a short-circuit at the melted and disconnected portions due to stress or the like, and it is possible to continuously maintain a stable state.

(3) The conductor 25 of the fuse element 11 is formed from polysilicon. Accordingly, since the conductor 25 may be formed similar to the gate wire 59 of the driver transistor T1 which causes the programming current Ip to flow to the conductor 25, a special manufacturing process may not be required. The conductor 25 and the gate wire 59 may be simultaneously manufactured within a single process, and thus it may be possible to suppress the increase of manufacturing processes.

(4) The cover film 65 which covers the bulk formed on the semiconductor substrate 51 is used as the etching stopper film upon forming the contact holes 67 to 69 on the inter-layer insulating film 66 formed on the cover film 65. Accordingly, it is possible to reliably form the plug 67 connected to the source region 56 and the drain region 57 of the driver transistor T1, the plug 68 connected to the conductor 62, and the plug 69 connected to the resistor R1. There may be no need to separately form an etching stopper film, and it is thereby possible to suppress the increase of manufacturing processes.

Figure 9A:
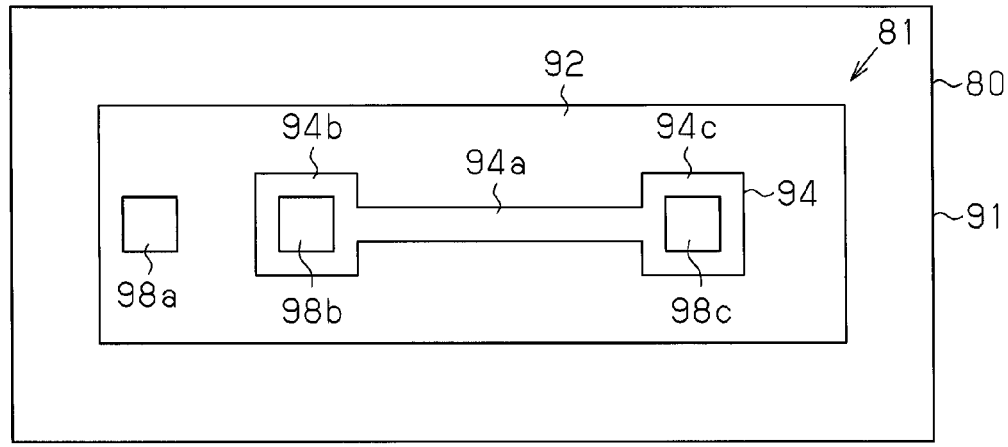
FIG. 9A and FIG. 9B are respectively a schematic plan view and a cross sectional view of a fuse element of a first modified example.
Figure 9B:
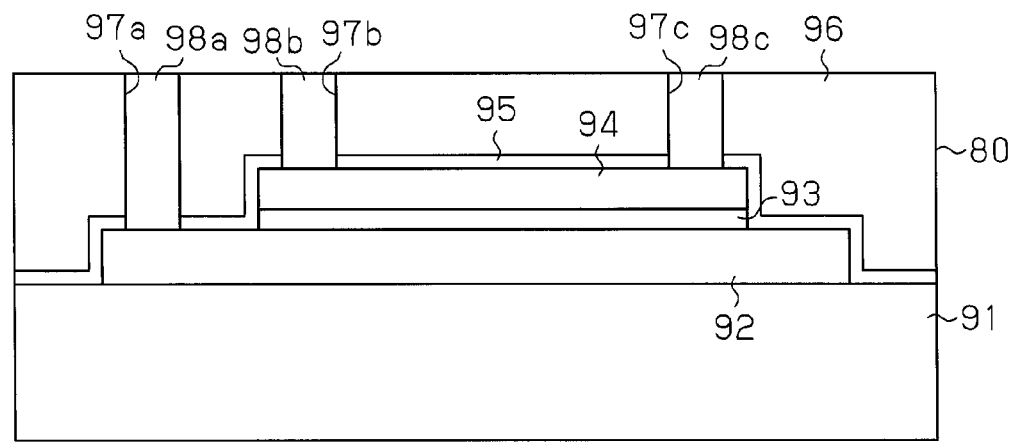

In a first modified example illustrated in FIG. 9A, a fuse element 81 is formed on a semiconductor device 80. The fuse element 81 schematically includes a first conductor 92 and a second conductor 94. As illustrated in FIG. 9B, the second conductor 94 is formed above the first conductor 92. As illustrated in FIG. 9A, when viewed from above the semiconductor substrate, the second conductor 94 overlaps with a part of the first conductor 92. The first conductor 92 is, for example, a polycrystalline silicon (polysilicon) film. The second conductor 94 is, for example, a polycrystalline silicon film.

As illustrated in FIG. 9B, the first conductor 92 is formed on an insulating region 91 formed on the semiconductor substrate. The insulating region 91 is, for example, LOCOS or STI. As illustrated in FIG. 9A, the first conductor 92 is formed in a hexahedron shape.

As illustrated in FIG. 9B, an insulating film 93 is formed on the first conductor 92. The insulating film 93 is, for example, a silicon oxide film ($SiO_2$) or a multi-layer insulating film. The multi-layer insulating film is a film (so-called ONO film) in which, for example, a silicon oxide film ($SiO_2$), a silicon nitride film (SiN), and a silicon oxide film ($SiO_2$) are laminated from the lower layer toward the upper layer.

A second conductor 94 is formed on the insulating film 93. The conductor 94 includes a connection strip 94a formed in an oblong shape extending along a predetermined direction (horizontal direction in FIG. 9B), and terminals 94b, 94c formed in a rectangular shape at both ends of the connection strip 94a.

A cover film 95 is formed on the conductor 94. The cover film 95 is formed so as to cover the entire surface of the surface (upper surface) side of the semiconductor substrate. Accordingly, the upper surface and the side surface of the conductor 94 are covered by the cover film 95. In addition, the cover film 95 covers the upper surface and the side surface of the first conductor 92. The cover film 95 has greater tensile strength than the insulating film 93. The cover film 95 is, for example, a silicon nitride film (SiN, $Si_3N_4$).

An inter-layer insulating film 96 is formed on the cover film 95. The inter-layer insulating film 96 is, for example, a silicon oxide film. The upper surface of the inter-layer insulating film 96 is formed in a flat shape for facilitating the formation of a wire on the upper layer not illustrated. As illustrated in FIG. 9B, a contact hole 97a which extends from the upper surface to the first conductor 92 is formed on the inter-layer insulating film 96. A plug 98a connected to the first conductor 92 is formed in the contact hole 97a. Similarly, as illustrated in FIG. 9B, contact holes 97b, 97c which extend from the upper surface to the terminals 94b, 94c of the conductor 94 are formed on the inter-layer insulating film 96. Plugs 98b, 98c connected to the connection strips 94b, 94c of the conductor 94 are formed in the contact holes 97b, 97c.

As described above, the fuse element 81 includes a multi-layer film formed from the polysilicon film 92, the insulating film 93, and the polysilicon film 94. This kind of multi-layer film is used, for example, in a non-volatile memory cell including a floating gate. In other words, the fuse element 81 is formed with the same process as a non-volatile memory cell. Accordingly, the fuse element 81 may be formed without requiring a special process and the increase of processes may be suppressed.

Figure 10:
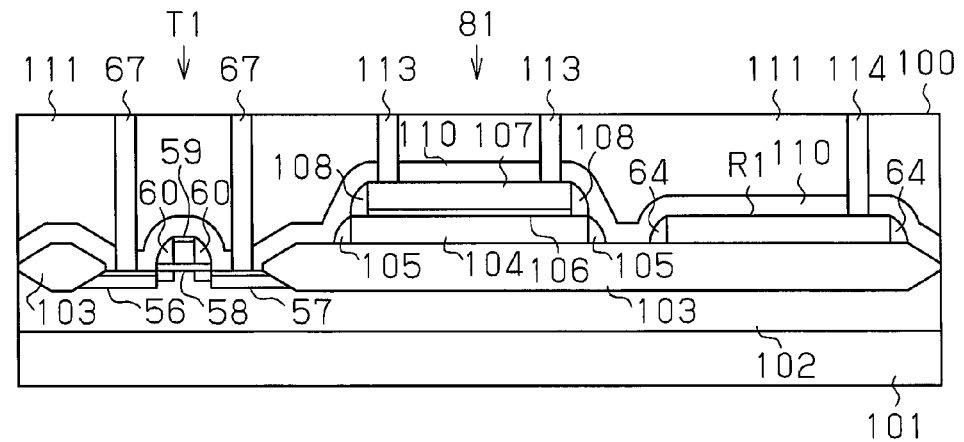
FIG. 10 is a schematic cross sectional view of a semiconductor device of a second modified example.

The foregoing fuse element 81 may be used, for example, in the timing circuit illustrated in FIG. 5. FIG. 10 illustrates a schematic cross section of a semiconductor device according to a second modified example that includes the trimming circuit using the fuse element 81. As with the semiconductor device 40 illustrated in FIG. 6, the semiconductor device 100 includes a driver transistor T1, a fuse element 81, and a resistor R1. The fuse element 81 is formed on an element isolation region 103 which is formed on the resistor R1.

A first conductor 104 is formed on the element isolation region 103. A side wall 105 is formed at a side part of the first conductor 104. An insulating film 106 is formed on the first conductor 104, and a second conductor 107 is formed on the insulating film 106. A side wall 108 is formed at a side part of the second conductor 107.

Each element (bulk) is covered by a cover film 110. An inter-layer insulating film 111 is formed on the cover film 110. Plugs 113 connected to both ends of the second conductor 107 by penetrating the inter-layer insulating film 111 are formed. While omitted in FIG. 10, a plug connected to the first conductor 104 is formed.

The method of manufacturing this semiconductor device is now discussed.

Figure 11A:
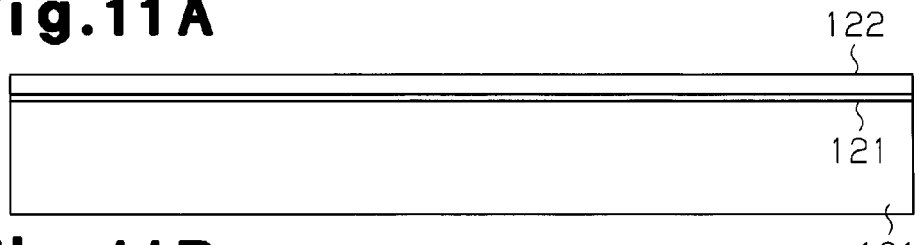
FIG. 11A to FIG. 11F and FIG. 12A to FIG. 12E are schematic cross sectional views illustrating the method for manufacturing a semiconductor device.
Figure 11B:
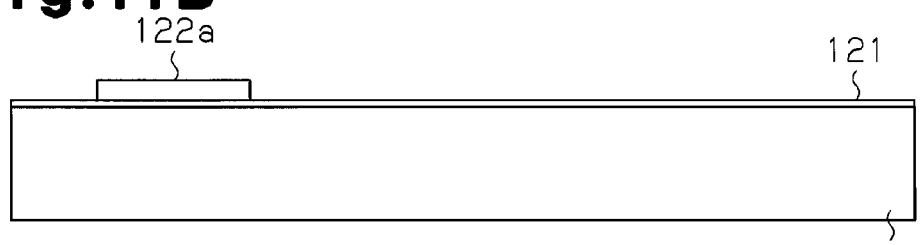

As illustrated in FIG. 11A, an oxide film 121 is formed on one surface (upper surface) of the semiconductor substrate 101, and a silicon nitride film 122 is formed on the oxide film 121. For example, under a temperature condition of 850° C., the semiconductor substrate 101 is subject to thermal oxidation so as to form the oxide film 121 having a film thickness of 3 nm. For example, the silicon nitride film 122 having a film thickness of 115 nm is formed via CVD under a temperature condition of 775° C. Subsequently, the silicon nitride film 122 is etched with a resist mask that was formed via the photolithography process and, as illustrated in FIG. 11B, a silicon nitride film 122a for forming element isolation is formed.

Figure 11C:
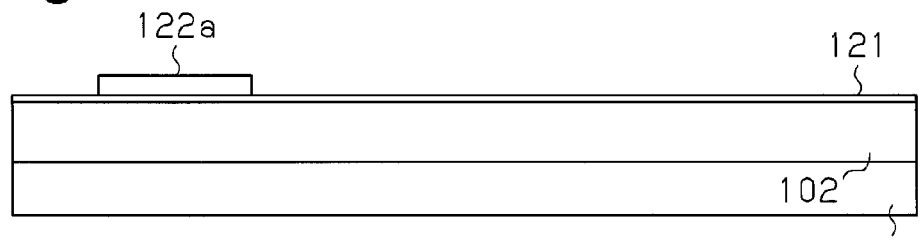
Figure 11D:
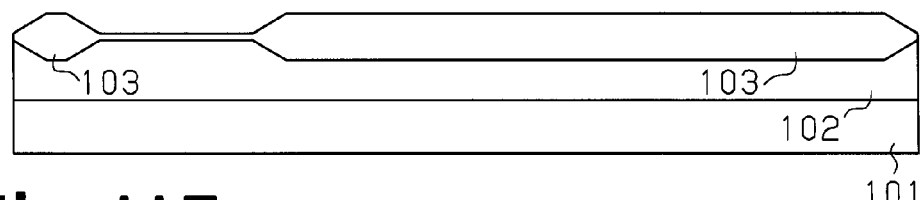

Subsequently, as illustrated in FIG. 11C, a well region 102 is formed. A well region 102 is formed on the semiconductor substrate 101 by doping or implanting with a P-type impurity (dopant). The P-type dopant impurity is, for example, boron (B). The ion implantation conditions are, for example, accelerating voltage of 160 key, and dose amount of $1.2 \times 10^{13}$ $cm^{-2}$. Subsequently, as illustrated in FIG. 11D, an element isolation region 103 having a film thickness of 370 nm is formed via wet oxidation under a temperature condition of 1000° C. The silicon nitride film 122a illustrated in FIG. 11C is removed.

Figure 11E:
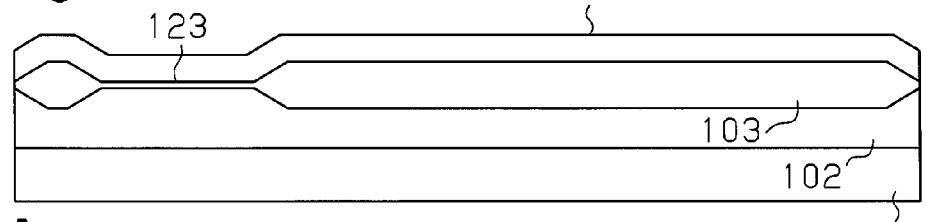
Figure 11F:
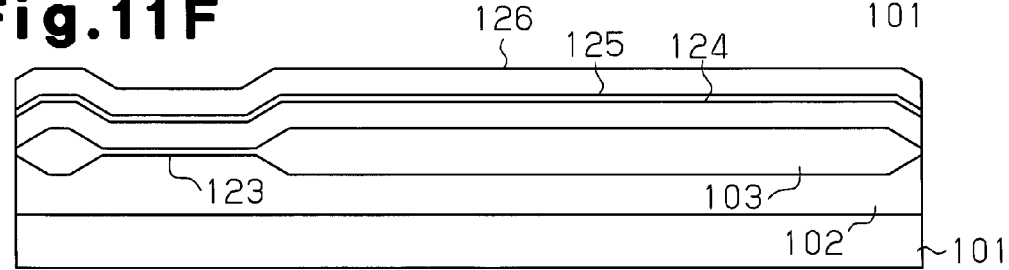

Subsequently, as illustrated in FIG. 11E, thermal oxidation is performed under a temperature condition of 1000° C. to form an oxide film 123 having a film thickness of, for example, 18.5 nm. Subsequently, a polycrystalline silicon film (polysilicon film) 124 having a film thickness of 300 nm is deposited, for example, via the CVD method. Subsequently, as illustrated in FIG. 11F, an oxide film 125 having a film thickness of 25 nm is deposited, for example, via the CVD method under a temperature condition of 750° C. Subsequently, a polycrystalline silicon film (polysilicon film) 126 having a film thickness of 100 nm is deposited, for example, via the CVD method.

Figure 12A:
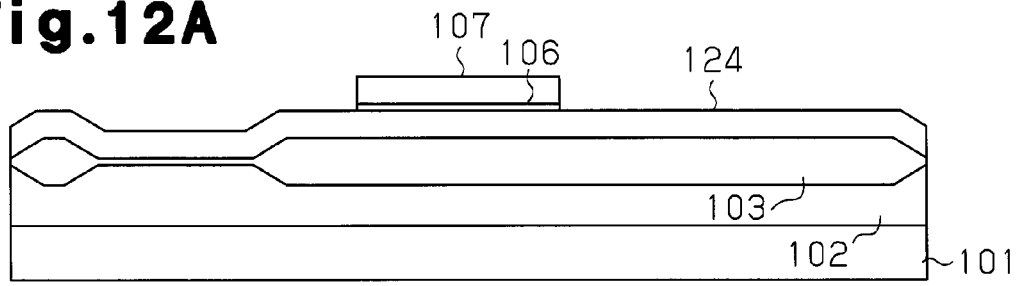
Figure 12B:
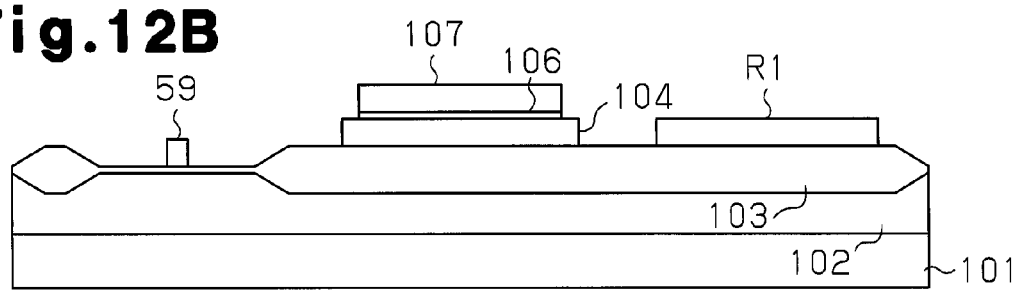

Subsequently, the polysilicon film 126 and the oxide film 125 are etched using the resist mask that was formed via the photolithography process so as to form, as illustrated in FIG. 12A, the second conductor 107, and the corresponding insulating film 106. Subsequently, the polysilicon film 124 is etched using the resist mask that was formed via the photolithography process so as to form, as illustrated in FIG. 12B, the gate wire 59 of the driver transistor T1, the first conductor 104 of the fuse element 81, and the resistor R1.

Figure 12C:
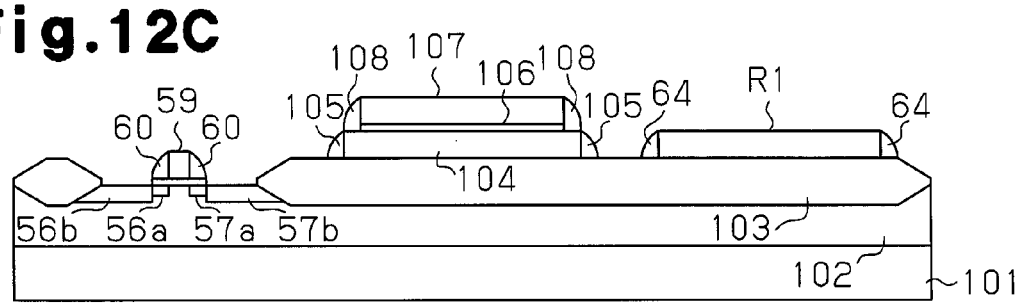

Subsequently, as illustrated in FIG. 12C, an N-type impurity is doped or implanted into the well region 102 to form lightly-doped N⁻ diffusion regions 56a, 67a, for example, via the ion implantation method. Subsequently, the side walls 60, 64, 105, 108 are formed. Subsequently, an N-type impurity is doped or implanted into the well region 102 to form highly-doped N⁺ diffusion regions 56b, 57b, for example, via the ion implantation method.

Figure 12D:
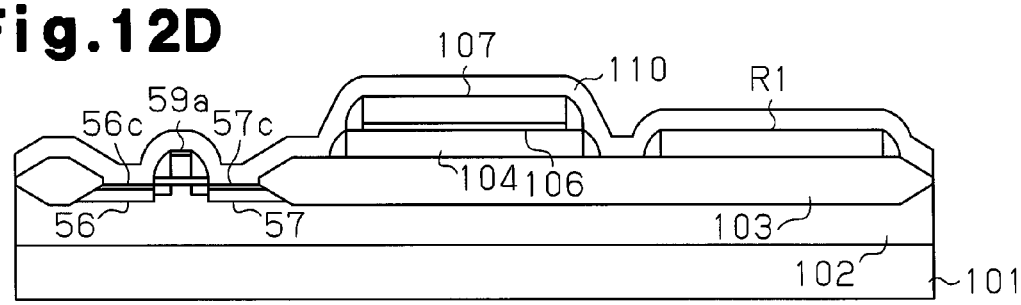
Figure 12E:
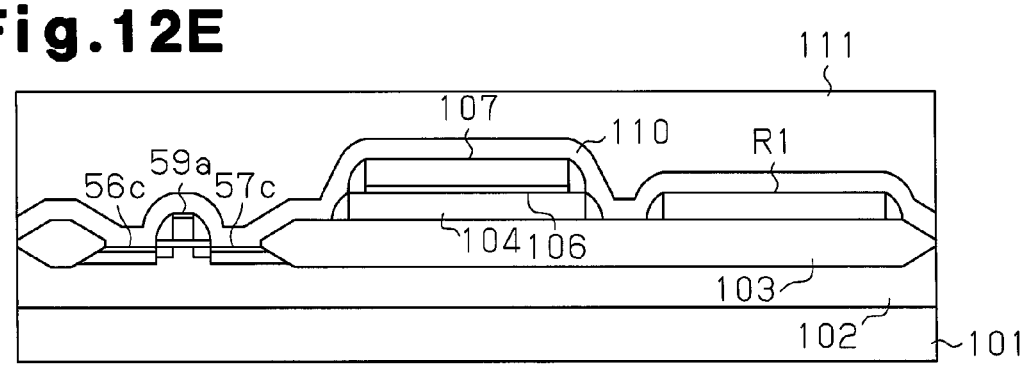

Subsequently, as illustrated in FIG. 12D, silicide layers 59a, 56c, 57c are formed at the upper part of the gate wire 59 and at the upper part of the diffusion regions 56, 57. Subsequently, a cover film 110 having a film thickness of 80 nm is deposited, for example, via the CVD method. Subsequently, as illustrated in FIG. 12E, an inter-layer insulating film 111 having a film thickness of 1400 nm is deposited on the bulk, for example, via the CVD method, and the surface of the inter-layer insulating film 111 is planarized, for example, via the CMP method.

As described above, the second embodiment yields the following effects in addition to the effects of the first embodiment.

(5) The fuse element 81 includes the first conductor 104, the insulating film 106, and the second conductor 107 formed on the element isolation region. Accordingly, there may be no need to form a diffusion region or a well region, and the element isolation region may be formed at an arbitrary location.

It should be apparent to those skilled in the art that the present invention may be embodied in many other specific forms without departing from the spirit or scope of the invention. Particularly, it should be understood that the present invention may be embodied in the following forms.

In the embodiments, the material of the conductors 92, 94 and the like illustrated in FIG. 9A and FIG. 9B may be arbitrarily modified. For example, at least one of the conductors 92, 94 may be a metal film resistor. As the material for use in a metal film resistor, for example, used may be aluminum (Al), molybdenum (Mo), or nickel chromium alloy (NiCr).

The insulating region 91 is used as the wire inter-layer film. Since the fuse element 81 is formed on the wire inter-layer film, the fuse element 81 may be formed, for example, above the driver transistor T1 or the resistor R1, and the size of the trimming circuit may be reduced thereby. Accordingly, it may be possible to suppress the increase in the size of the semiconductor device including the fuse element 81.

The shape, size, film thickness and the like of the connection strips 25a, 94a, the diffusion region 22, and the first conductor 92 in the embodiments are merely examples and may be arbitrarily modified.

The temperature and other conditions in the manufacturing process are merely examples and may be arbitrarily changed.

The impurity (dopant) may be arbitrarily changed. For example, arsenic (As), antimony (Sb) or the like may be used as the N-type impurity. Aluminum (Al) or the like may be used as the P-type impurity.

The driver transistor T1 may also be a P-channel MOS transistor.

It is also possible to supply a lower level voltage VSS to the wire 31 and supply a higher level voltage VDD to the wire 32 illustrated in FIG. 4.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A fuse, comprising:
   a first conductor;
   an insulating film on the first conductor;
   a second conductor on the insulating film;
   a cover film located on the second conductor and having tensile strength;
   an inter-layer insulating film formed on the cover film;
   a first plug formed in the cover film and the inter-layer insulating film, and coupled to the first conductor; and
   a second plug and a third plug each formed in the cover film and the inter-layer insulating film, and each coupled to the second conductor.

2. The fuse according to claim 1, wherein the second conductor ruptures the insulating film in response to a programming current to short the first conductor and the second conductor.

3. The fuse according to claim 1, wherein the cover film is in contact with at least an upper surface of the second conductor but is not contact with a lower surface of the second conductor.

4. The fuse according to claim 1, wherein the insulating film is in contact with an upper surface of the first conductor and a lower surface of the second conductor, and wherein the cover film is in contact with the entire second conductor excluding the lower surface of the second conductor.

5. A semiconductor device, comprising:
   a first node having a first potential;
   a second node having a second potential;
   an output node;
   a fuse coupled to the first node and the output node, the fuse including
     a first conductor coupled to the output node,
     an insulating film on the first conductor,
     a second conductor on the insulating film, the second conductor including a first terminal coupled to the first node,
     a cover film which covers an upper surface and a side surface of the second conductor and has tensile strength,
     an inter-layer insulating film formed on the cover film,
     a first plug formed in the cover film and the inter-layer insulating film, and coupled to the first conductor, and
     a second plug and a third plug each formed in the cover film and the inter-layer insulating film, and each coupled to the second conductor;
   a transistor coupled between a second terminal of the second conductor and the second node, the transistor causing a programming current to flow to the second conductor in response to a programming voltage supplied to a gate of the transistor; and
   a resistor coupled between the output node and the second node.

6. The semiconductor device according to claim 5, wherein the cover film includes a silicon nitride film.

7. The semiconductor device according to claim 5, wherein the first conductor is a diffusion region or a well region formed on a semiconductor substrate, and
   the second conductor is a semiconductor film or a metal resistor film.

8. The semiconductor device according to claim 5, wherein the second conductor is a semiconductor film or a metal resistor film formed on an element isolation region.

9. A manufacturing method of a semiconductor device including a fuse, the method comprising:
   forming a well for a MOS-type transistor on a surface of a semiconductor substrate;
   forming a first conductor of the fuse on the surface of the semiconductor substrate;
   forming an insulating film of the fuse on the first conductor;
   forming a polysilicon film on the insulating film;
   etching the polysilicon film to form a gate wire of the MOS-type transistor and a second conductor of the fuse;
   forming a cover film that covers a bulk of the semiconductor substrate;
   forming an inter-layer insulating film on the cover film;
   forming a first plug formed in the cover film and the inter-layer insulating film, and coupled to the first conductor; and
   forming a second plug and a third plug each in the cover film and the inter-layer insulating film, and each coupled to the second conductor.

10. The method according to claim 9,
   wherein the etching the polysilicon film forms a resistor on an element isolation region.

11. The method according to claim 9, wherein the insulating film is in contact with an upper surface of the first conductor and a lower surface of the second conductor, and wherein the forming the cover film includes covering the entire second conductor excluding the lower surface of the second conductor with the cover film.

12. A manufacturing method of a semiconductor device including a fuse, the method comprising:
   forming a well for a MOS-type transistor on a surface of a semiconductor substrate;
   forming a first insulating film of the fuse on the surface of the semiconductor substrate;
   forming a first polysilicon film on the first insulating film;
   forming a second insulating film on the first polysilicon film;
   forming a second polysilicon film on the second insulating film;
   etching the second polysilicon film and the second insulating film to form an insulator and a second conductor of the fuse;
   etching the first polysilicon film to form a gate wire of the MOS-type transistor and a first conductor of the fuse;
   forming a cover film on a bulk of the semiconductor substrate;
   forming the inter-layer insulating film on the cover film;
   forming a first plug formed in the cover film and the inter-layer insulating film, and coupled to the first conductor; and
   forming a second plug and a third plug each in the cover film and the inter-layer insulating film, and each coupled to the second conductor.

13. The method according to claim 12,
   wherein the etching of the first polysilicon film includes forming a resistor on an element isolation region.

14. The method according to claim 12, wherein the insulator of the fuse is in contact with an upper surface of the first conductor of the fuse and a lower surface of the second conductor of the fuse, and wherein the forming the cover film includes covering the entire second conductor excluding the lower surface of the second conductor with the cover film.

15. The fuse according to claim 1, further comprising an insulating region formed in a semiconductor substrate, and
   wherein the first conductor is located on the insulating region.

16. The fuse according to claim 15, wherein
   the first conductor includes polysilicon, and
   the second conductor includes polysilicon.

17. The fuse according to claim 15, wherein whole of the second conductor is located above the first conductor.

* * * * *